United States Patent [19]

Kagamida

[11] Patent Number: 5,555,091
[45] Date of Patent: Sep. 10, 1996

[54] WAFER DIAMETER/SECTIONAL SHAPE MEASURING MACHINE

[75] Inventor: Takeshi Kagamida, Tokyo, Japan

[73] Assignee: Tokyo Seimitsu Co., Ltd., Tokyo, Japan

[21] Appl. No.: 373,036

[22] Filed: Jan. 17, 1995

[30] Foreign Application Priority Data

Jan. 27, 1994 [JP] Japan .................. 6-023582

[51] Int. Cl.⁶ ................................ G01N 21/86
[52] U.S. Cl. .................. 356/384; 356/386; 250/559.24
[58] Field of Search ................ 356/384–387, 356/375, 376, 399–401, 73, 381, 382; 250/561, 548, 559.3, 559.33, 559.24, 559.29

[56] References Cited

U.S. PATENT DOCUMENTS

| | | | |
|---|---|---|---|
| 4,853,880 | 8/1989 | Akamatsu et al. | 356/400 |
| 5,175,595 | 12/1992 | Fukase | 356/386 |
| 5,194,743 | 3/1993 | Aoyama et al. | 356/400 |
| 5,350,899 | 9/1994 | Ishikawa et al. | 356/386 |

FOREIGN PATENT DOCUMENTS

| | | |
|---|---|---|
| 60-104644 | 6/1985 | Japan . |
| 62-38304 | 2/1987 | Japan . |
| 62-214310 | 9/1987 | Japan . |
| 63-16959 | 1/1988 | Japan . |
| 4-128605 | 4/1992 | Japan . |

*Primary Examiner*—Hoa Q. Pham
*Attorney, Agent, or Firm*—Oliff & Berridge

[57] ABSTRACT

The present invention relates to a wafer diameter/sectional shape measuring machine in which the diameter and the sectional shape of the wafer can be measured together. The diameter/sectional shape measuring machine is arranged in the wafer chamfering machine so that the chamfering conditions of the wafer can be adjusted in a short time without taking the wafer out from the wafer chamfering machine. The wafer diameter/ sectional shape measuring machine comprises a position control mechanism. The position control mechanism positions a center and an orientation flat of a wafer on a wafer table. The wafer table, which can rotate and move vertically, adsorbs and holds the wafer. A shape detector detects a sectional shape of the wafer. A measuring mechanism drives the shape detector in the direction of the wafer table and detects a moving value. The moving value is based on the distance that the measuring mechanism moves the shape detector. An image processing mechanism calculates the sectional shape of the wafer from the data detected by the shape detector. A size calculating mechanism calculates the diameter of the wafer in accordance with the signals from the image processing mechanism and the moving value.

9 Claims, 12 Drawing Sheets

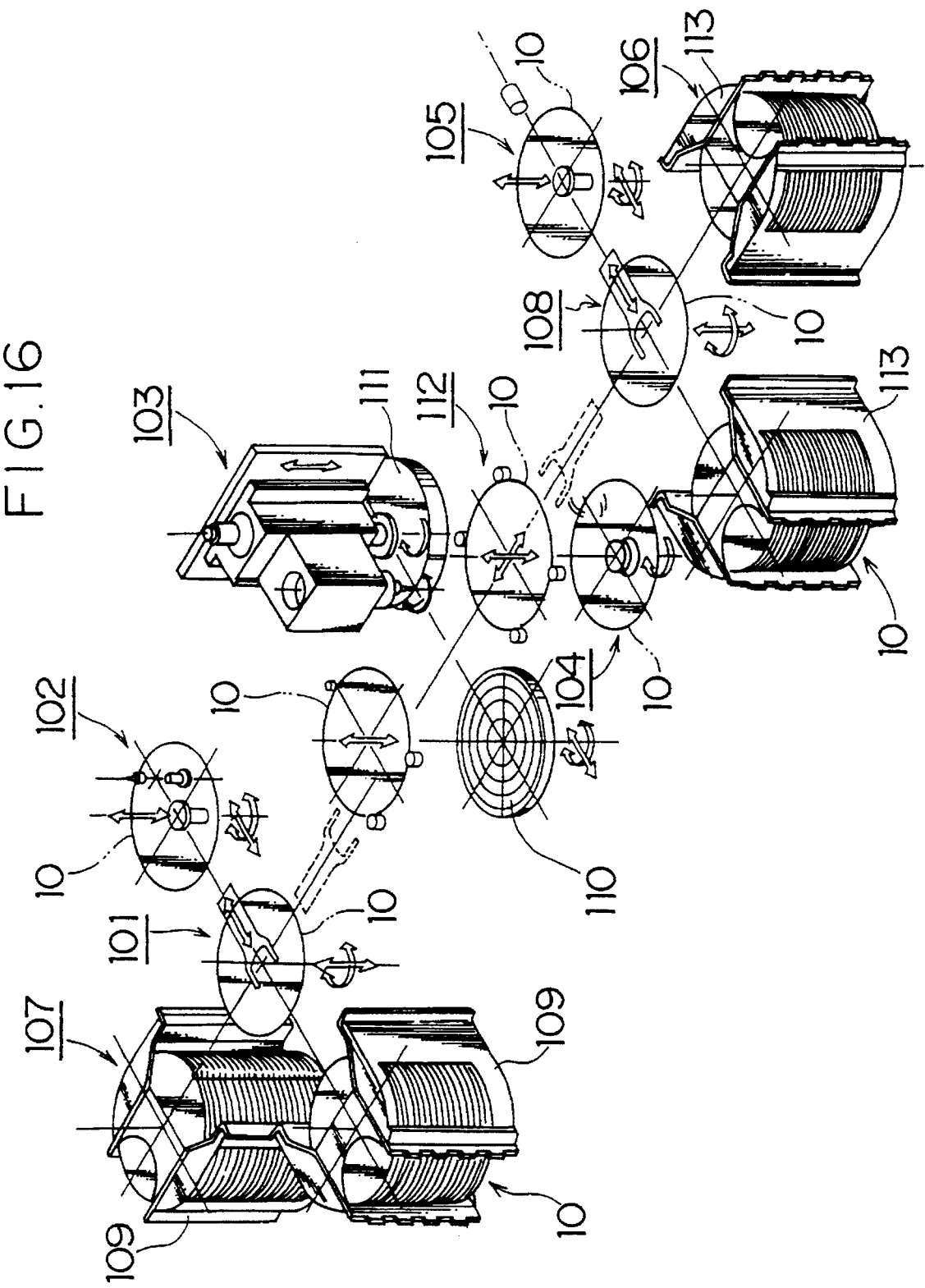

WAFER DIAMETER/SECTIONAL SHAPE MEASURING MACHINE

BACKGROUND OF THE INVENTION

1. Field of the Invention

The present invention relates to a wafer diameter/sectional shape measuring machine for measuring the diameter and the sectional shape of the wafer such as silicon serving as a raw material for a semiconductor element.

2. Description of the Related Art

A wafer such as silicon serving as a raw material for a semiconductor element, is produced in a way that the wafer is cut into a thin piece from an ingot by a slicing machine. Thereafter, the outer periphery thereof is chamfered by use of a wafer chamfering machine. An orientation flat or a notch is formed in the periphery of the wafer for positioning and orienting the wafer, and is chamfered also.

FIG. 8 shows an outer appearance of the wafer with the orientation flat. In FIG. 8, designated at D is the diameter of the circular part 11 of the wafer, and L an orientation flat diameter (a distance from the circular part 11 to the orientation flat 12 ). Moreover, FIG. 13 shows an outer appearance of the wafer with the notch. In FIG. 13, designated at D is the diameter of the circular part 11 of the wafer, α an opening angle of a notch 13, δ an inclination of the center of the notch 13 to the center of the circular part 11, and M is a notch distance (a distance from the circular part 11 to the notch 13). Incidentally, a circle at the notch is a circle for indicating this distance, therefore, it is not a part of the wafer.

FIG. 9 shows a sectional shape required for the outer periphery of the wafer. FIG. 9 shows that Bu and Bd are widths of chamfering; θ u and θ d are tapered angles; Ru and Rd have curved corners and t is an outer periphery (not pointed). T is a thickness of the wafer. The diameter D, the orientation flat diameter L, the notch distance M and the sectional shape have tolerances, and, when they fail to meet the tolerances, the wafer becomes defective.

Further, the outer periphery of the wafer as described above and as follows includes the circular part 11, and the orientation flat 12 or the notch 13 of the wafer.

In the wafer chamfering machine, the wafer is positioned at the center of the circular part 11, and the orientation flat 12 or the notch 13 on the position control station, thereafter, the wafer is sent to the processing station. In the processing station, the wafer is adsorbed and held by the wafer table by vacuum and the like, and the relative vertical position between the wafer table and the processing grindstone is set. Thereafter the wafer table and the processing grindstone are rotated relative to each other, whereby the outer periphery of the wafer is chamfered.

In this case, the processing conditions (the relative vertical position between the wafer table and the processing grindstone, the relative horizontal position between the wafer table and the processing grindstone, the rotational speed of the wafer table and the like) are adjusted previously, however, in order to properly process the diameter D, the orientation flat diameter L, the notch distance M and the sectional shape shown in FIGS. 8, 9 and 13 accurately, one wafer is test-processed, and then, the diameter D, the orientation flat diameter L and the notch distance M are measured with the dimensional measuring machine and the sectional shape is measured with the shape measuring machine and confirmed, respectively, and correction values are inputted to the processing machine in accordance with the measured data so as to readjust the processing conditions. Usually, this operation is repeated several times, and then, the mass production is started.

However, in the conventional method, in order to accurately adjust the processing conditions of the wafer chamfering, the wafer, which has been test-processed, is taken out from the wafer chamfering machine and measured by another measuring machine. Then, the correction values are inputted to the processing machine in accordance with the measured data and another un-processed wafer is attached to the wafer chamfering machine to test-process again. Usually, it is necessary to be repeat this operation, therefore, there is a problem in that it takes a long time to set the processing conditions of the wafer chamfering. Moreover, the diameter D, the orientation flat diameter L, the notch distance M and the sectional shape are measured with different measuring machines, therefore, there is another problem in that it takes a long time to measure them.

Further, when the processing is run continuously, it is likely that the diameter D, the orientation flat L, the notch distance M and the sectional shape of the wafer are not processed accurately because of the abrasions and the like from the processing grindstone, therefore, there are problems in that the processing conditions of the wafer chamfering must be adjusted by the same operation during mass production and all wafers must be inspected after the processing.

SUMMARY OF THE INVENTION

The present invention has been developed to eliminate the above-described. The object of the invention is to provide a wafer diameter/sectional shape measuring machine in which the diameter and the sectional shape of the wafer can be measured together. Another object of the invention is to provide a wafer diameter/sectional shape measuring machine which is arranged with a wafer chamfering machine, whereby the diameter and the sectional shape of the wafer can be measured without taking the wafer out from the processing machine and the measured results are fed back to the wafer chamfering machine, so that the processing conditions of the wafer chamfering can be adjusted in a short time.

To achieve the above-described objects, a wafer diameter/sectional shape measuring machine comprises: a wafer table for adsorbing and holding a wafer, which can rotate and move vertically; position control means for positioning a center of said wafer and either an orientation flat or a notch of said wafer at a predetermined position on said wafer table; shape detecting means for detecting a sectional shape of said wafer; measuring means for driving said shape detecting means in a direction of said wafer table and provided with moving value detecting means for detecting a moving value of said shape detecting means; image processing means for calculating said sectional shape of said wafer based on data detected by said shape detecting means; and, size calculating means for calculating a diameter of said wafer based on a signal from said image processing means and a signal from said moving value detecting means.

Further, the wafer diameter/sectional shape measuring machine is integrated in the process after the wafer washing of the wafer chamfering machine. The wafer washing entails washing the wafer after processing.

According to the wafer diameter/sectional shape measuring machine of the present invention, when the wafer is conveyed on the wafer table, the center of the circular part and the orientation flat or the notch of the wafer are positioned by the position control means and the wafer is absorbed and held by the wafer table by vacuum and the like. Then, the shape detecting means is driven in the direction of the wafer by the measuring means in a manner that the diameter direction of the wafer periphery measuring part comes into the measuring range of the shape detecting means. And, the wafer table is driven vertically in manner that the thickness direction of the wafer periphery measuring part comes into the measuring range of the shape detecting means.

The data of the wafer periphery, which are detected by the shape detecting means, are sent to the image processing means so as to calculate the sectional shape of the wafer. And, the moving value of the shape detecting means is detected by the moving value detecting means, the detected moving value and the positional data at the circular part of the wafer, which are calculated at the image processing means, are sent to the size calculating means and then, the diameter of the wafer is calculated.

The wafer is rotated by the wafer table, whereby the diameter and the sectional shape of a wafer at a position can be measured.

Further, the wafer diameter/sectional shape measuring machine according to the present invention is arranged in the wafer chamfering machine, and when the chamfering of the periphery is finished at the wafer chamfering machine, the wafer is sent to the wafer diameter/sectional shape measuring machine and the diameter and the sectional shape of the wafer are measured, thereafter, the measured results are fed back to the wafer chamfering machine. In the wafer chamfering machine, subsequent chamfering conditions are adjusted by the feed-back value.

BRIEF DESCRIPTION OF THE DRAWINGS

The exact nature of this invention, as well as other aims and advantages thereof, will be readily apparent from consideration of the following specification relating to the accompanied drawings, in which like reference characters designate the same or similar parts throughout the figures thereof and wherein:

FIG. 16 is a plan view showing processing steps of a wafer in a wafer chamfering machine.

DESCRIPTION OF THE PREFERRED EMBODIMENT

A detailed description will hereafter be given of the preferred embodiment of a wafer diameter/sectional shape measuring machine according to the present invention with reference to the accompanying drawings.

Figure 1:
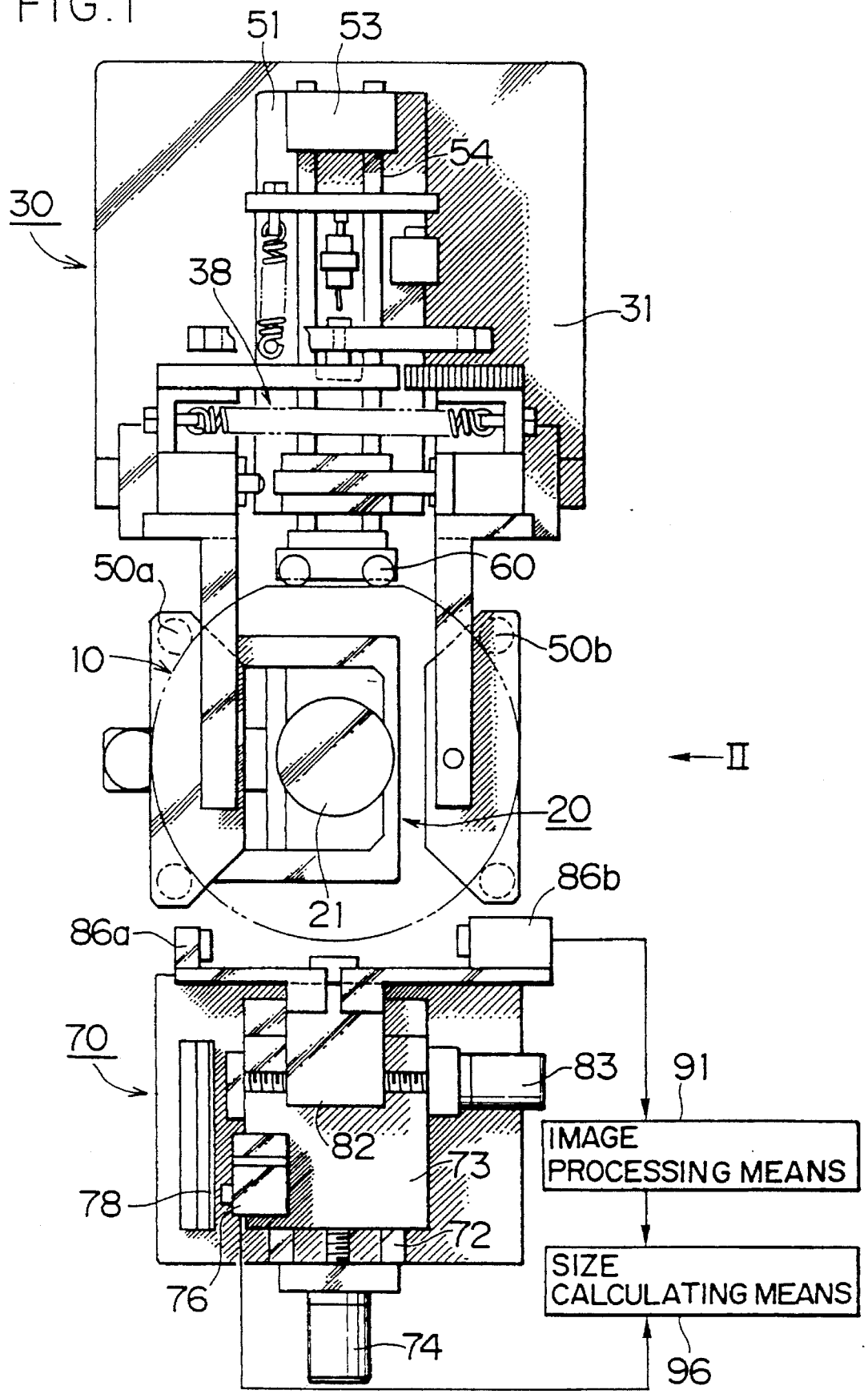
FIG. 1 is an overall plan view showing an embodiment of the wafer diameter/sectional shape measuring machine according to the present invention.
Figure 2:
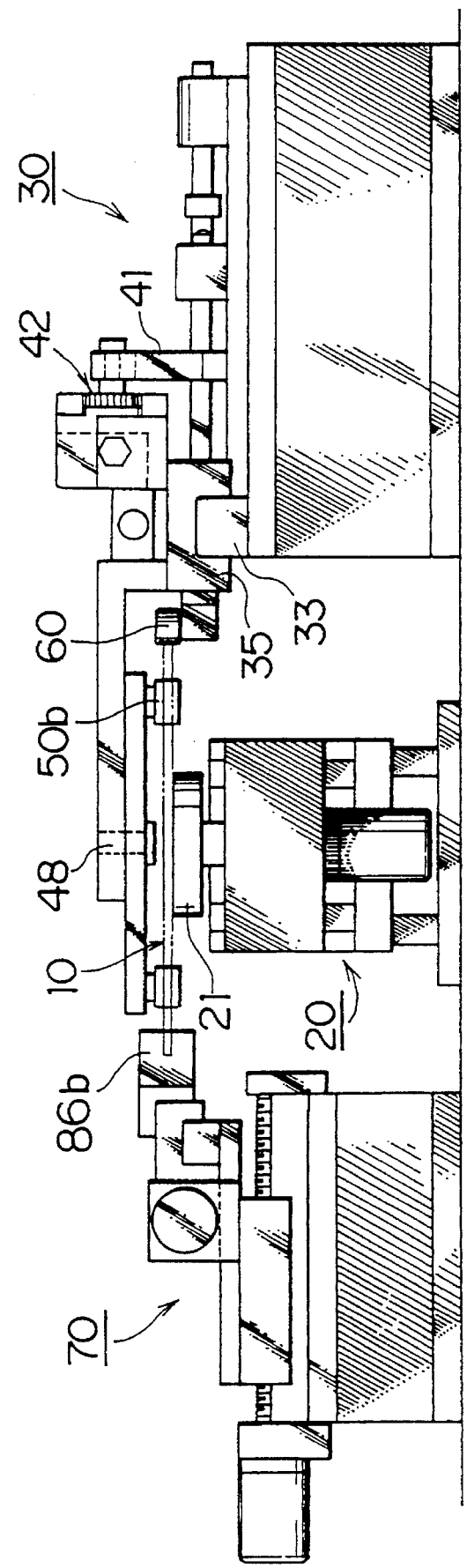
FIG. 2 is a side elevational view taken from the direction of the arrow II of FIG. 1.
Figure 3:
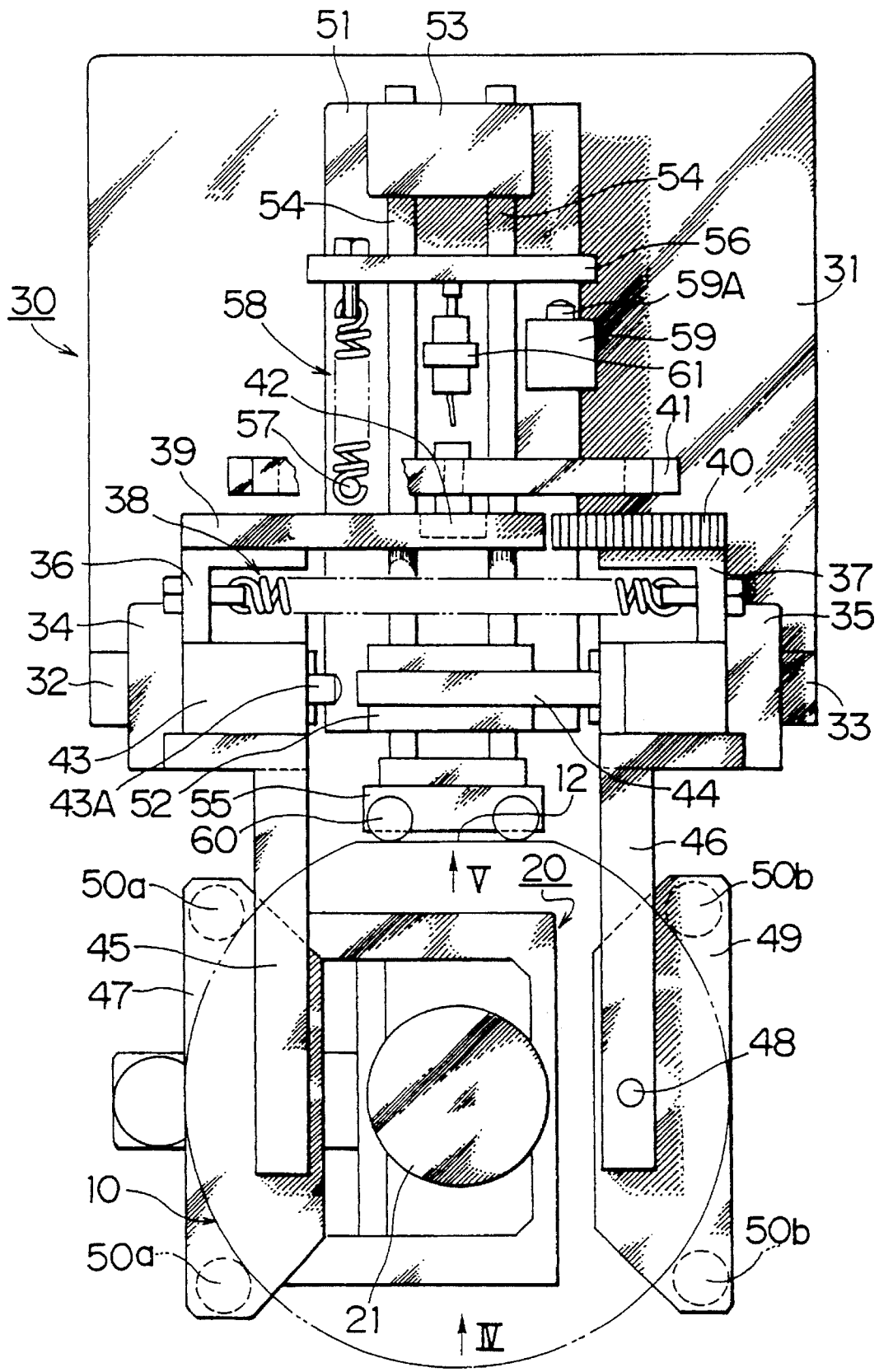
FIG. 3 is a plan view showing the wafer table part and the position control means of the embodiment of the wafer diameter/sectional shape measuring machine according to the present invention.
Figure 4:
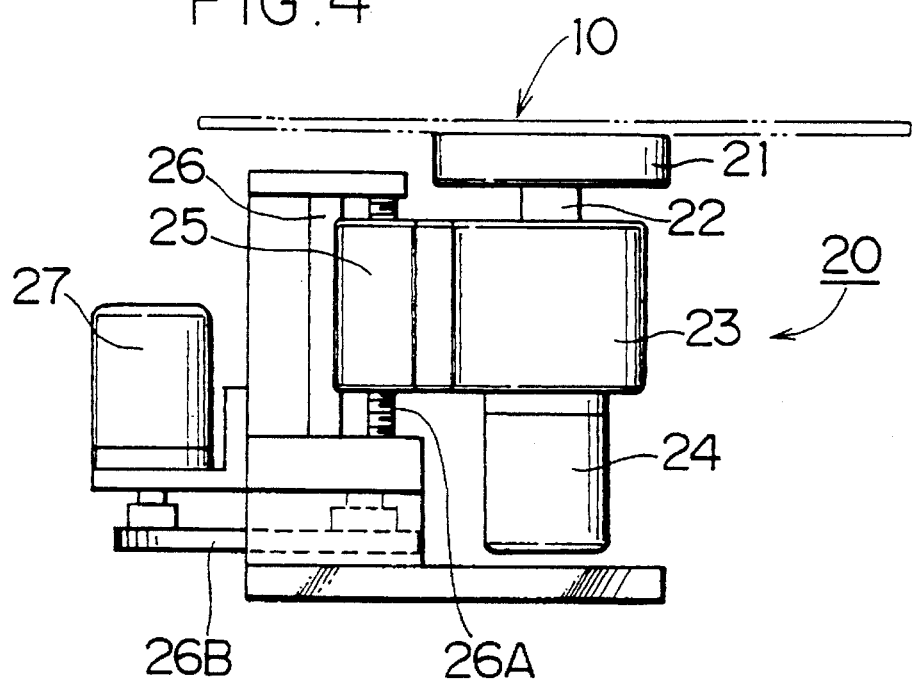
FIG. 4 is a front elevational view indicated by the arrow IV of FIG. 3.
Figure 5:
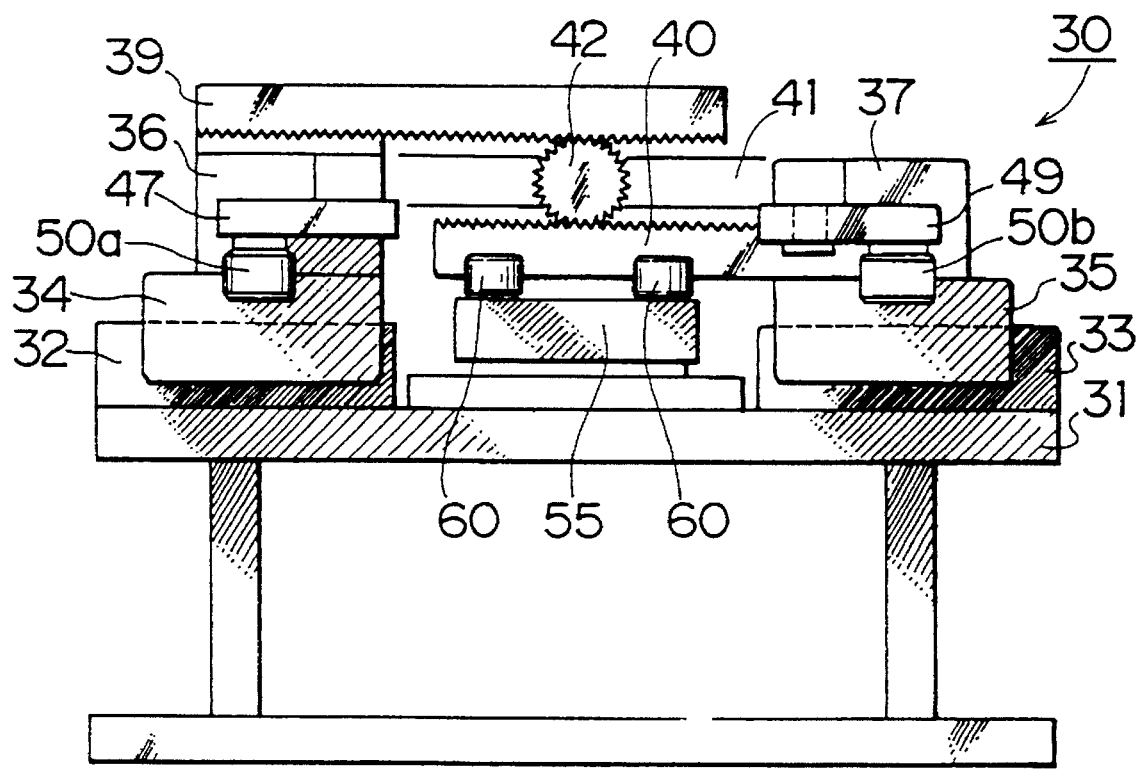
FIG. 5 is a front elevational view indicated by the arrow V of FIG. 3.
Figure 6:
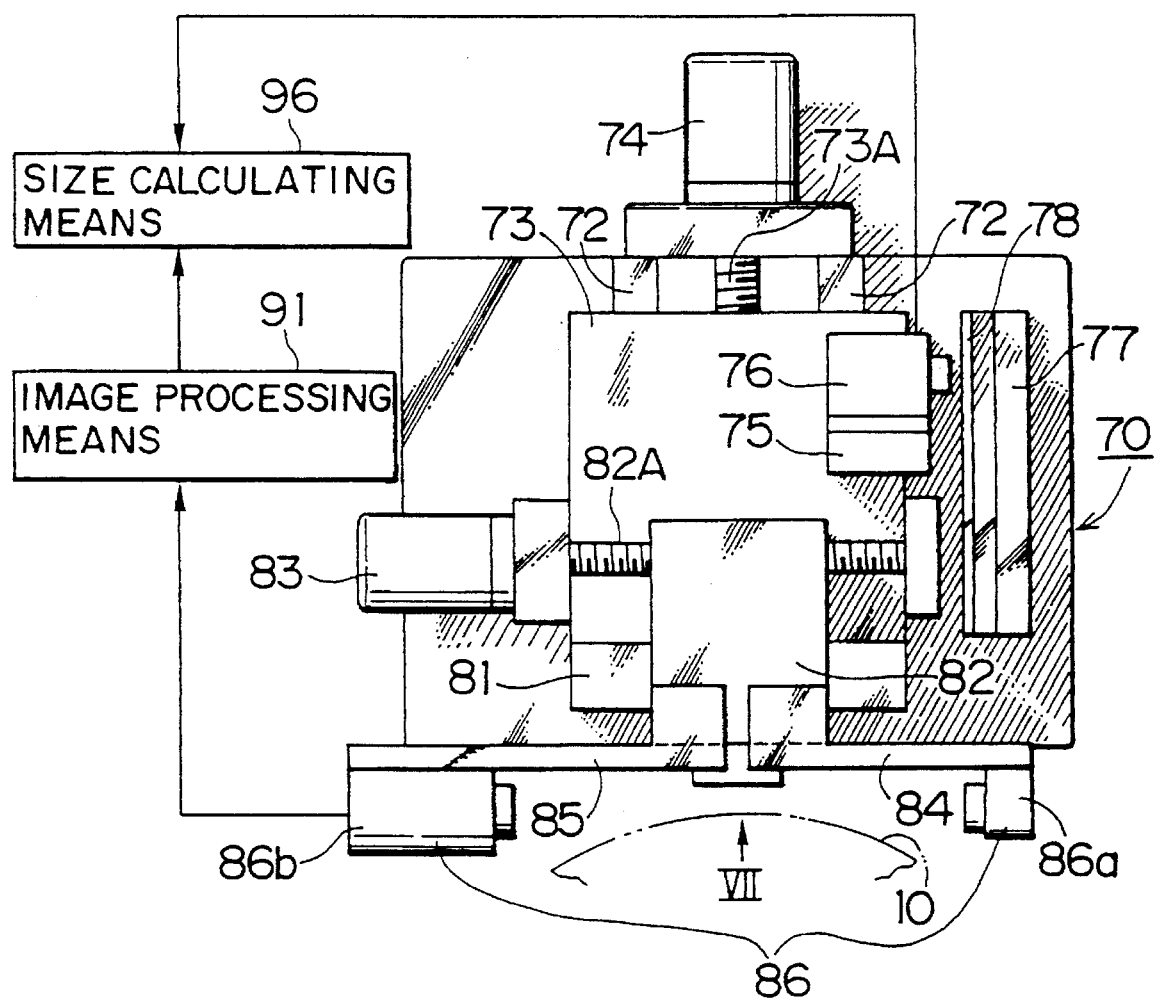
FIG. 6 is a plan view showing the measuring means in the embodiment of the wafer diameter/sectional shape measuring machine according to the present invention.
Figure 7:
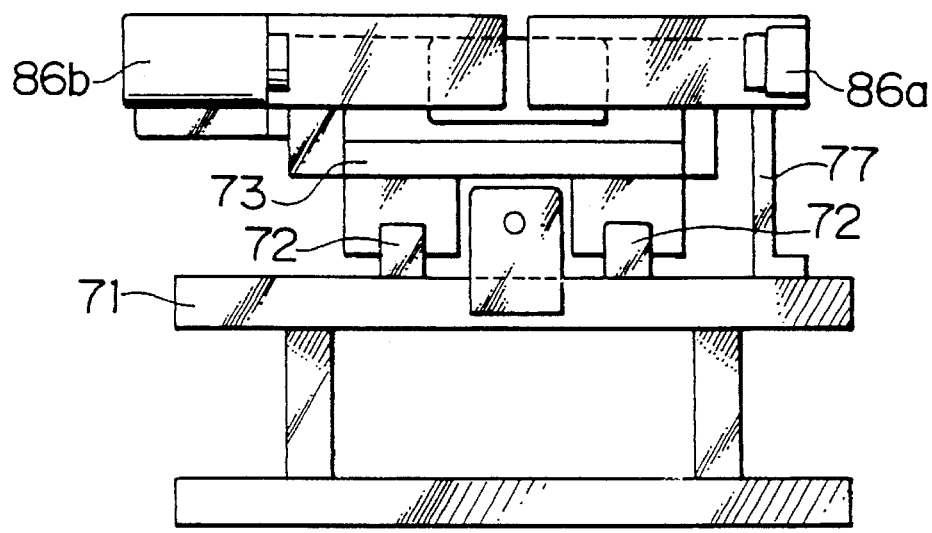
FIG. 7 is a front elevational view indicated by the arrow VII of FIG. 6.
Figure 8:
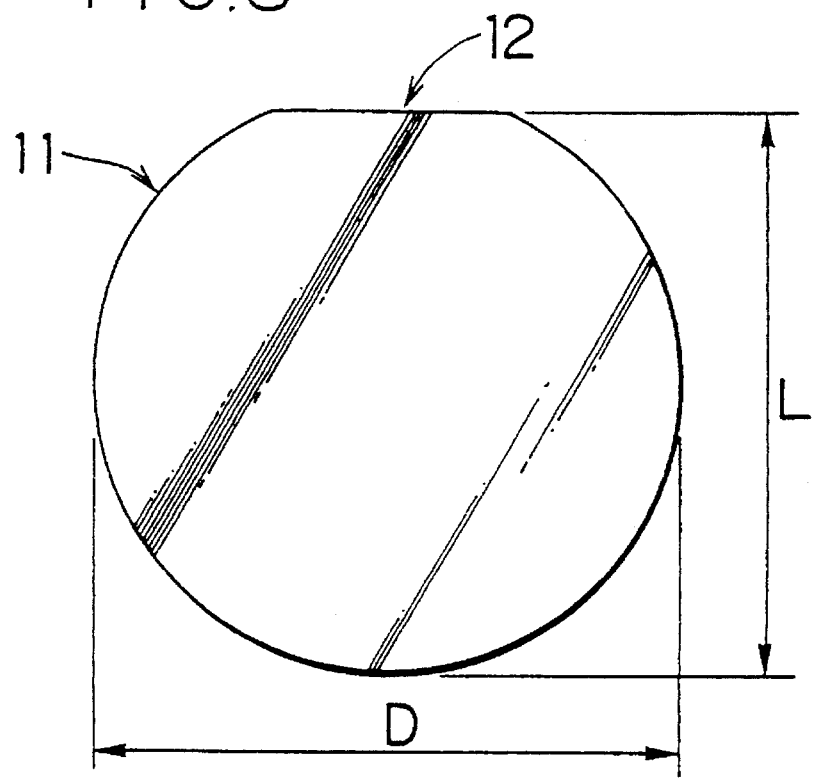
FIG. 8 is a plan view showing an outer appearance of the wafer with the orientation flat.
Figure 9:
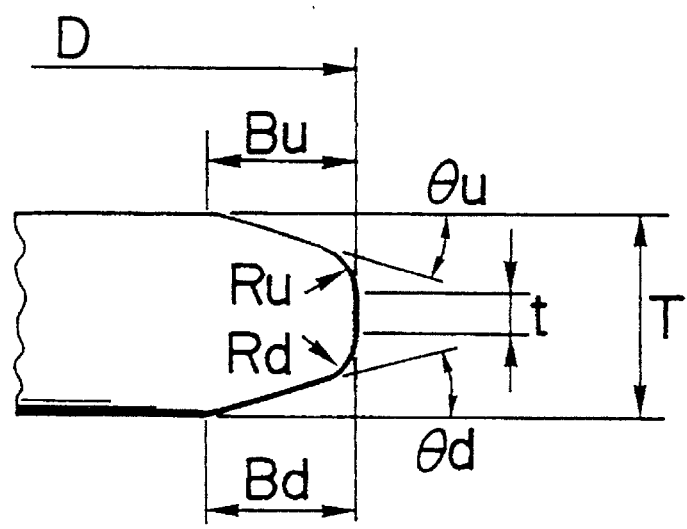
FIG. 9 is a partial side elevational view showing the sectional shape required for the wafer periphery.

FIGS. 1–7 show a wafer diameter/sectional shape measuring machine according to the present invention. FIG. 1 is an overall plan view, FIG. 2 is a side elevational view taken from the direction of H, FIG. 3 is a plan view of a wafer table part and a position control means (a partial enlarged view of FIG. 1), FIG. 4 is a front elevational view indicated by the arrow IV of FIG. 3, FIG. 5 is a front elevational view indicated by the arrow IV of FIG. 3, FIG. 6 is a plan view of the measuring means (a rear elevational partial enlarged view of FIG. 1) and FIG. 7 is a view indicated by the arrow VII of FIG. 6.

As shown in FIGS. 1 and 2, a wafer table part 20 is placed at about the center of the wafer diameter/sectional shape measuring machine, and a position control means 30 is placed at one side of the wafer table part 20 and a measuring means 70 is placed at the other side.

In FIGS. 2, 3, and 4, the wafer table part 20 is attached to a table shaft 22 and a wafer table 21 for adsorbing and holding the wafer 10 by vacuum and the like is located on a table shaft receiving rack 23, and the table shaft 22 is rotated by a motor 24.

The table shaft receiving rack 23 is attached to a vertical slider 25, and the vertical slider 25 is guided by a vertical guide 26 movably in the vertical direction. Further, the vertical slider 25 is fixed to a lead screw 26A which is arranged in the vertical direction. The lead screw 26A is connected with a motor 27 through a belt 26B, the turning force from the motor 27 is transmitted through the belt 26B. Therefore, when the lead screw 26A is rotated by the motor 27 clockwise or counterclockwise, the vertical slider 25 is moved vertically by the function of the lead screw 26A along the vertical guide 26. With this arrangement, the wafer 10 is rotated and moved vertically in a state that the wafer 10 is adsorbed and held by the wafer table 21. As shown in FIGS. 2, 3, 5, the position control means 30 includes a mechanism for positioning the center of the wafer 10 and a mechanism for positioning the orientation flat. In the mechanism for positioning the center of the wafer 10, guides 32 and 33 are put on a base 31 and two sliders 34 and 35 are arranged over the guides 32 and 33 movably. Respective brackets 36 and 37 are attached to the sliders 34 and 35, and the brackets 36 and 37 are drawn to each other by a tension spring 38. And, a rack 39 is fixed to the bracket 36 and a rack 40 is fixed to the bracket 37. A pinion 42 is engaged with the racks 39 and 40 and is rotatably provided with a holder 41 which is fixed to the base 31. And, an escape cylinder 43 is attached to the slider 34 and a rod 44 is attached to the slider 35.

Arms 45 and 46 are fixed to the sliders 34 and 35, a roller holder 47 is provided with the arm 45, and a roller holder 49 is provided with the arm 46 through a shaft 48 so as to be rockable. Two pair of rotatable rollers 50a, 50a and 50b, 50b are attached to the respective roller holders 47 and 49.

Therefore, when there is no wafer 10, a piston 43A of the escape cylinder 43 is extended, so that the piston 43A is forced against the rod 44 and the roller holders 47 and 49 are opened against the force of the tension spring 38. When the wafer 10 is carried on the wafer table 21, the piston 43A of the escape cylinder 43 recedes from the rod 44, therefore, the roller holders 47 and 49 are drawn to each other, so that the wafer 10 is held by the four rollers 50a and 50b. When the wafer 10 is positioned, the two rollers 50a, 50a at the side of the roller holder 47 are treated as references, the roller holder 49 is rocked through the shaft 48 and the two rollers 50b, 50b are in contact with the wafer 10. The wafer table 21 is positioned previously in a manner that the rotational center of the wafer table 21 corresponds to the center of a reference disc which has the same shape-size as the wafer 10, when the reference disc is held by the four rollers 50a and 50b. Therefore, the center of the circular part 11 of the wafer 10 corresponds to the rotational center of the wafer table 21.

In the mechanism for positioning the orientation flat, a sub-base 51 is provided on the base 31, and guides 52 and 53 are arranged with the sub-base 51. Two guide shafts 54, 54 are provided movably with the guides 52, 53 and connected by back and forth connecting plates 55, 56. Hereinafter, the side of the wafer table part 20 is called the forth side, and the opposite side of the wafer table part 20 is call the back side. A tension spring 58 is provided between the back connecting plate 56 and a spring peg 57 fixed to the sub-base 51. The guide shafts 54, 54 and the connecting plates 55, 56 are forced by the tension spring 58 to project forth.

Moreover, an escape cylinder 59 and a sensor 61 are provided with the sub-base 51. And, two rotatable rollers 60, 60 are attached to the forth connecting plate 55.

Therefore, when the orientation flat is not positioned, a piston 59A of the escape cylinder 59 is extended so as to force the connecting plate 56, whereby the rollers 60, 60 move to the back side, however, when the orientation flat is positioned, the piston 59A of the cylinder 59 moves away from the connecting plate 56, whereby the rollers 60, 60 project to the forth side. When the connecting plate 55 is projected to the forth side in a state that the orientation flat 12 is not positioned, one of the two rollers 60, 60 are in contact with the orientation flat 12 to force the wafer 10. And the wafer 10 is rotated by the force in a state that the wafer 10 is held by the four rollers 50a, 50b, and when both of the rollers 60, 60 are in contact with the orientation flat 12, the wafer 10 stops rotating. When the orientation flat 12 is positioned accurately, a signal is outputted from the sensor 61.

In the measuring means 70 shown in FIGS. 6 and 7, two guides 72, 72 are laid on a base 71 parallel to the wafer table part 20, and a slider 73 is arranged over the guides 72, 72 so as to be movable along the guides 72, 72. The slider 73 is engaged to a lead screw 73A, which is arranged in parallel with the guides 72, 72. The lead screw 73A is connected with a motor 74 so as to transmit the turning force from the motor 74. Therefore, when the lead screw 74A is driven by the motor 74 clockwise or counterclockwise, the slider 73 is moved by the lead screw 73A along the guides 72, 72 in a direction to approach the wafer 10 or in a direction to leave from the wafer 10.

A moving value detector 76 is fixed on the slider 73 by means of a holder 75. And, a scale 78, which is detected by the moving value detector 76, is fixed on the base 71 by means of a holder 77. An absolute original position is set on the scale 78.

Therefore, the moving value of the slider 73 in the direction of the wafer table part 20 is detected as a moving value from the absolute original position by the moving value detector 76.

A guide 81 is arranged perpendicular to the guides 72, 72 on the slider 73, and a slider 82 is provided movably along the guide 81. The slider 82 is engaged to a lead screw 82A which is positioned parallel to the guide 81. The lead screw 82A is connected with a motor 83 so as to transmit the turning force from the motor 83. Therefore, when the lead screw 82A is driven by the motor 83 clockwise or counterclockwise, the slider 82 is moved by the lead screw 82A along the guide 81 in the diameter direction of the wafer 10.

A holder 84 is formed at the right side of the slider 82, and a holder 85 is formed at the left side of the slider 82. A projecting part 86a, which is one of the shape detectors 86, is attached to the holder 84, and a detecting part 86b, which is the other of the shape detector 86. The projecting part 86a and the detecting part 86b are positioned in opposition to each other, and are fixed so as to hold the wafer 10 in the diameter direction. With this arrangement, the focus of the shape detector 86 is adjusted for the wafer 10.

And, an image processing means 91 and a size calculating means 96 are provided in the measuring means 70. The data of the wafer periphery, which are detected by the shape detector 86, are sent to the image processing means 91, and the positional data at the circular part 11 of the wafer 10, which are calculated at the image processing means 91, and the moving value of the shape detector 86, which is detected by the moving value detector 76, are sent to the size calculating means 96.

An explanation will be given of the method of measuring the wafer diameter/sectional shape with the above-described wafer diameter/sectional shape measuring machine.

When the wafer 10 is sent to the wafer table 21, the center of the circular part 11 of the wafer 10 and the orientation flat 12 are positioned, and the wafer 10 is adsorbed and held by the wafer table 21 by vacuum and the like. Next, the shape detector 86 of the measuring means 70 is focused and the shape detector 86 is driven in the central direction of the wafer 10 in a manner that the diameter direction at the wafer periphery measuring part comes into the measuring range of the shape detector 86. And, the wafer table 21 is driven vertically in a manner that the thickness direction at the wafer periphery measuring part comes into the measuring range of the shape detector 86.

Figure 10:
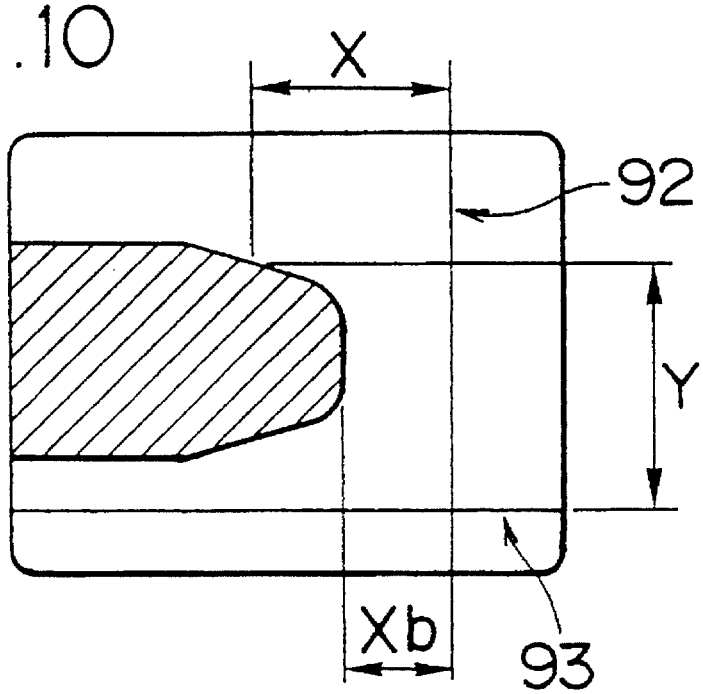
FIG. 10 is a CRT display view in the image processing means.

The data of the wafer periphery, which are detected by the shape detector 86, are sent to the image processing means 91. In the image processing means 91, the data of the wafer periphery, which are sent from the shape detector 86, are binarized into white and black so as to be displayed on the CRT. As shown in FIG. 10, a reference line 92 in the diameter direction of the wafer 10 and a reference line 93 in the thickness direction are predetermined, and then, the distance (X.Y) between the respective measured points of the sectional shape is read from the two reference lines 92 and 93 and is compared with the predetermined reference value so as to calculate the sectional shape value of the wafer 10.

Figure 11:
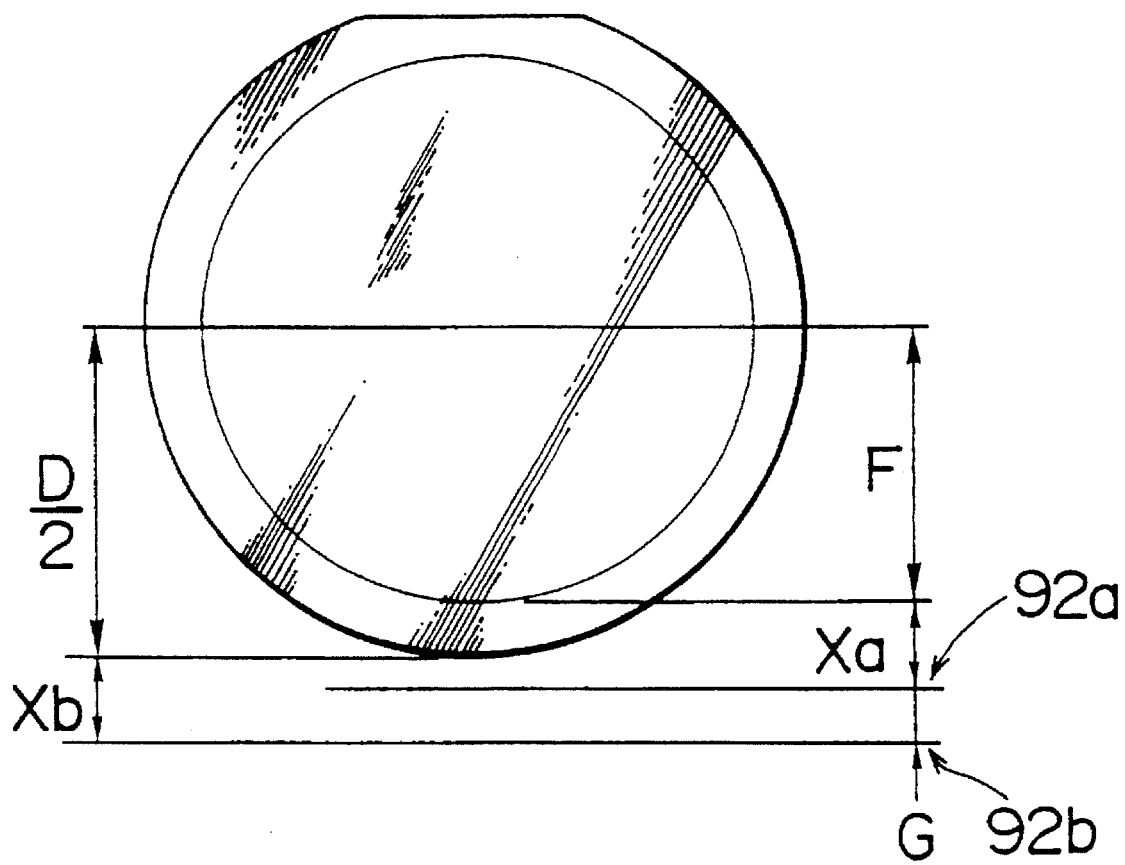
FIG. 11 is a plan view showing the diameter calculation of the wafer.

And, the distance Xb from the reference line 92 (92b in FIG. 11) in the diameter direction and the moving value G of the shape detector 86 are sent to the size calculating means 96. In the size calculating means 96, as shown in FIG. 11, the radius F of the reference disc and the distance Xa of the reference disc periphery position which is detected from the reference line 92 (92b in FIG. 11) when the reference disc is measured by the shape detector 86, are stored previously, and the distance Xb and the moving value G during measuring the wafer 10 are calculated with reference to these as follows, whereby the diameter D at the circular part 11 of the wafer 10 is calculated.

$$D=2(F+Xa+G-Xb)$$

When the diameter and the sectional shape at a peripheral position of the wafer 10 are measured, the wafer is rotated by the wafer table 21. In this case, the peripheral position of the wafer 10 is indicated by the angle with reference to the position of the orientation flat 12.

Figure 14:
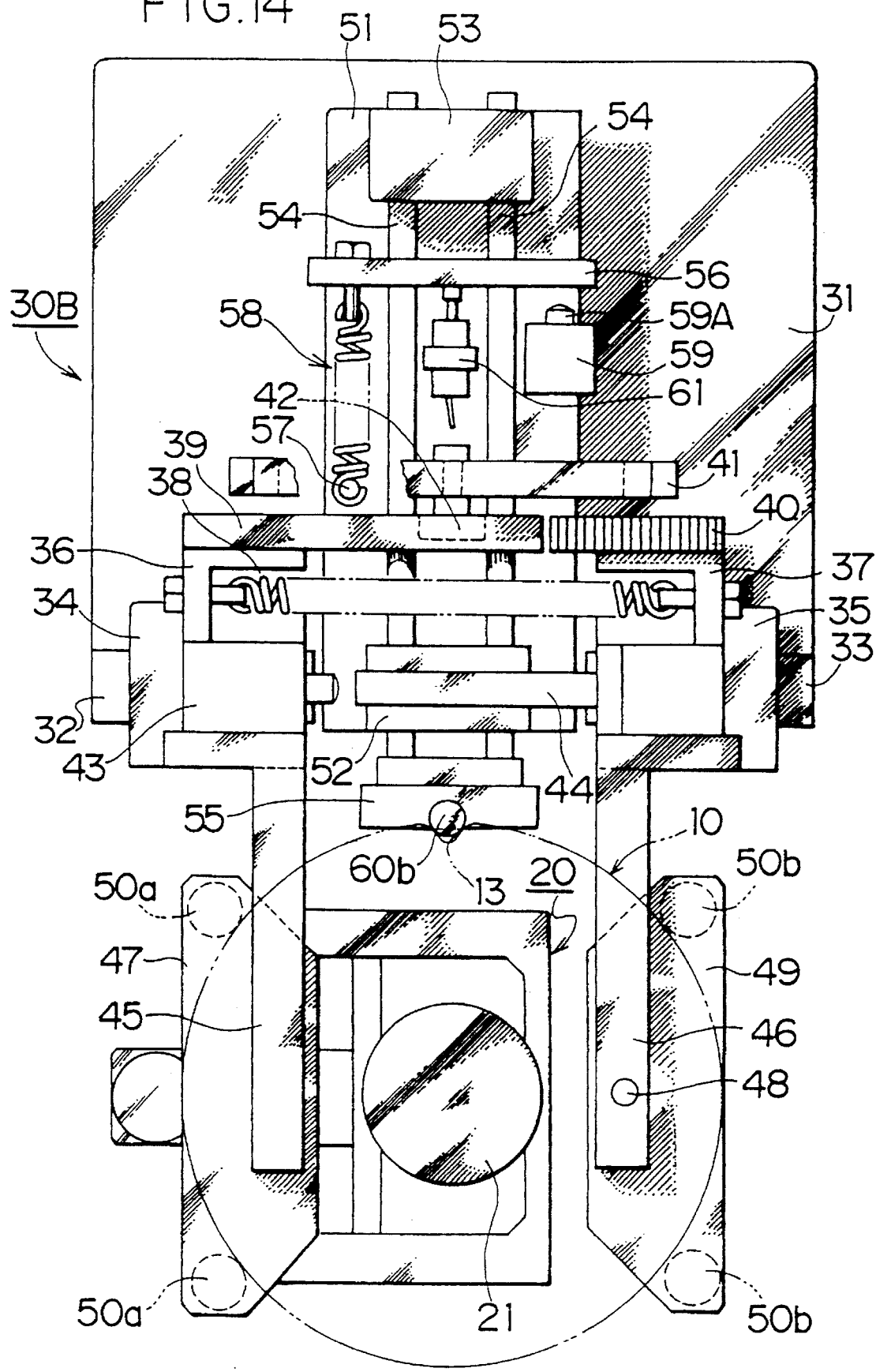
FIG. 14 is a plan view showing the wafer table part and the position control means of the embodiment of the wafer diameter/sectional shape measuring machine according to the present invention.

FIG. 14 shows a plan view of the position control means 30B for a wafer with a notch, and the same or similar members of the position control means 30 for a wafer with an orientation flat are designated with the same numeral numbers and the explanations thereof are omitted. In the position control means 30B for the wafer with the notch, one roller 60b which is in contact with the notch 13 is arranged at the center of the connecting plate 55 instead of the two rollers 60 for positioning the peripheral direction of the wafer in the position control means 30 for the wafer with the orientation flat, and the mechanism for positioning the center of the wafer 10 is similar.

The wafer table part 20 shown in FIG. 4 shows that a mechanism for driving the wafer table 21 vertically through the vertical slider 25 is a screw feeding, however, the present invention should not be limited to this, therefor, another mechanism in which horizontal change of the wafer table 21 is small while driving vertically may be used in the present invention.

And, the position control means 30 shown in FIG. 3 and the position control means 30B shown in FIG. 14 are embodiments, therefore, another mechanism for positioning accurately the center of the circular part 11 of the wafer 10 and orientation flat 12 or the notch 13 may be used.

Further, the measuring means 70 shown in FIG. 6 shows that the mechanism for driving the slider 73 is a screw feeding, however, the present invention should not be limited to this, therefore, another mechanism in which the change in the horizontal direction perpendicular to the driving direction is small while driving in the horizontal direction may be used. And, the embodiment shows that the focus adjusting means of the shape detector 86 is a screw feeding, however, the present invention should not be limited to this, therefore, another mechanism in which the change in the direction perpendicular to the driving direction of the shape detector 86 is small while driving in the horizontal direction may be used, or when the focal depth of the shape detector 86 is deep, the focus adjusting means can be omitted. The linear detecting method is used as the moving value detecting means of the shape detector 86 with the scale 78 and the moving value detector 76, however, another detecting method such as a rotational detecting method may be used.

Figure 12:
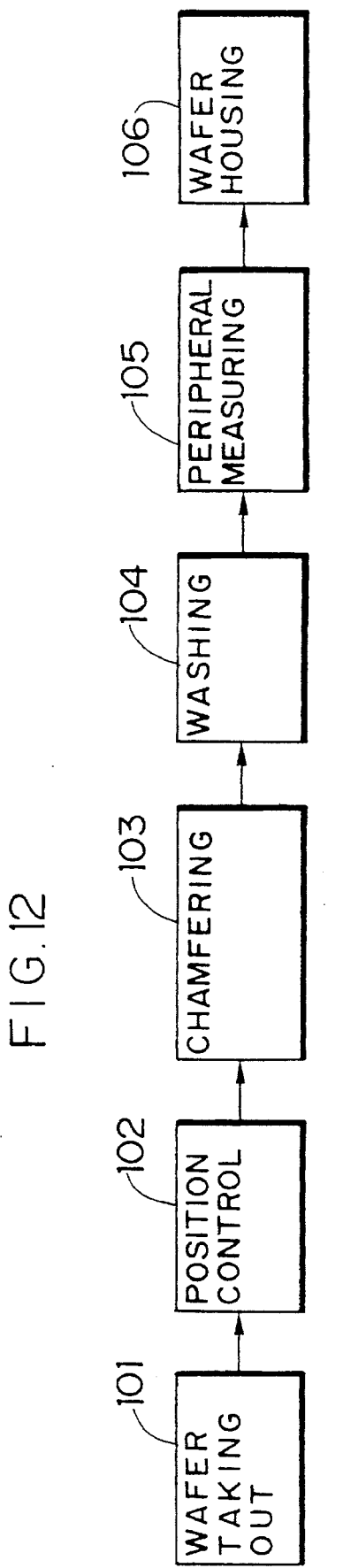
FIG. 12 is a block diagram showing the overall construction of the embodiment wherein the wafer chamfering machine is provided in the wafer diameter/sectional shape measuring machine according to the present invention.
Figure 13:
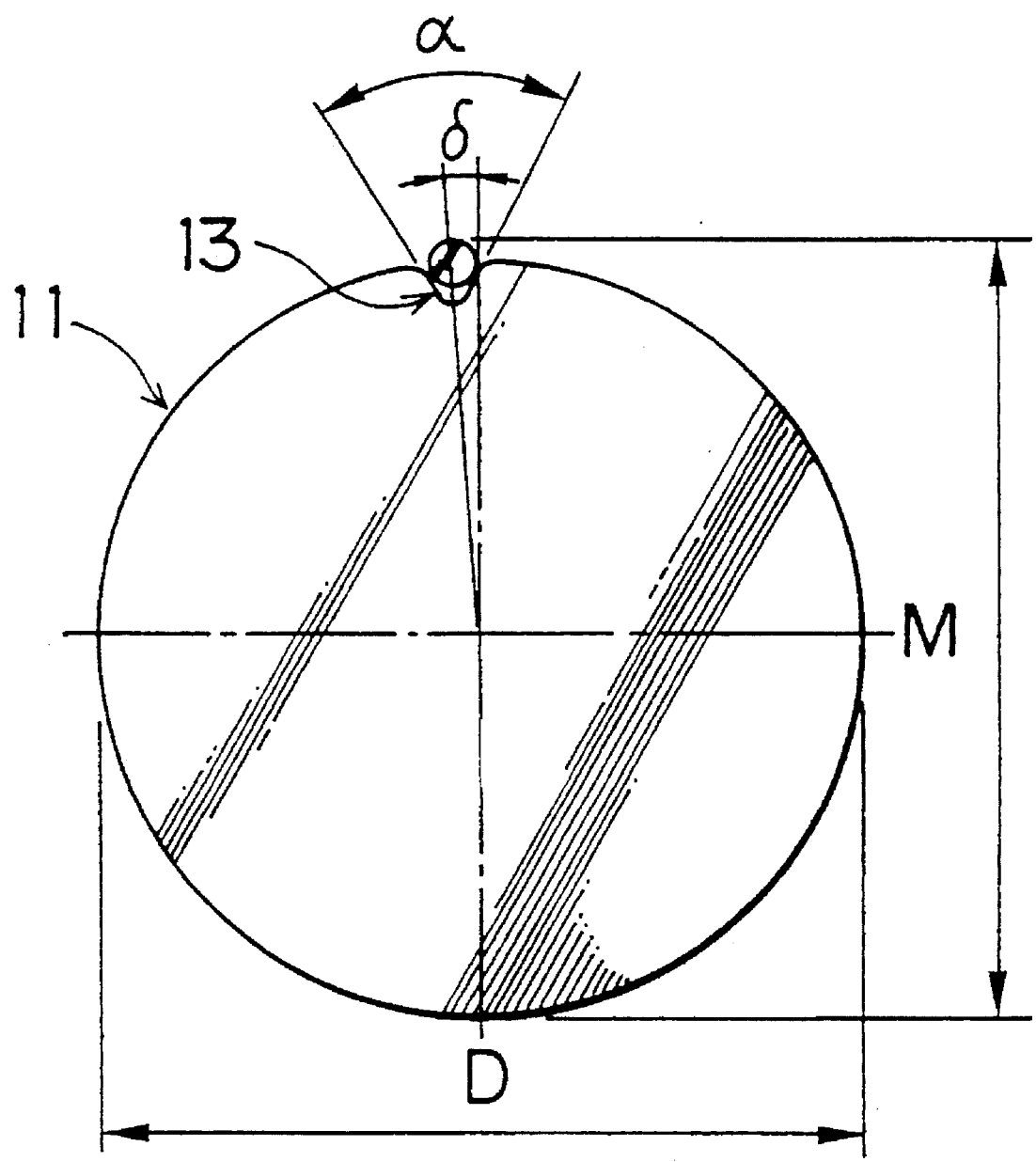
FIG. 13 is a plan view showing the outer appearance of the wafer with the notch.
Figure 15:
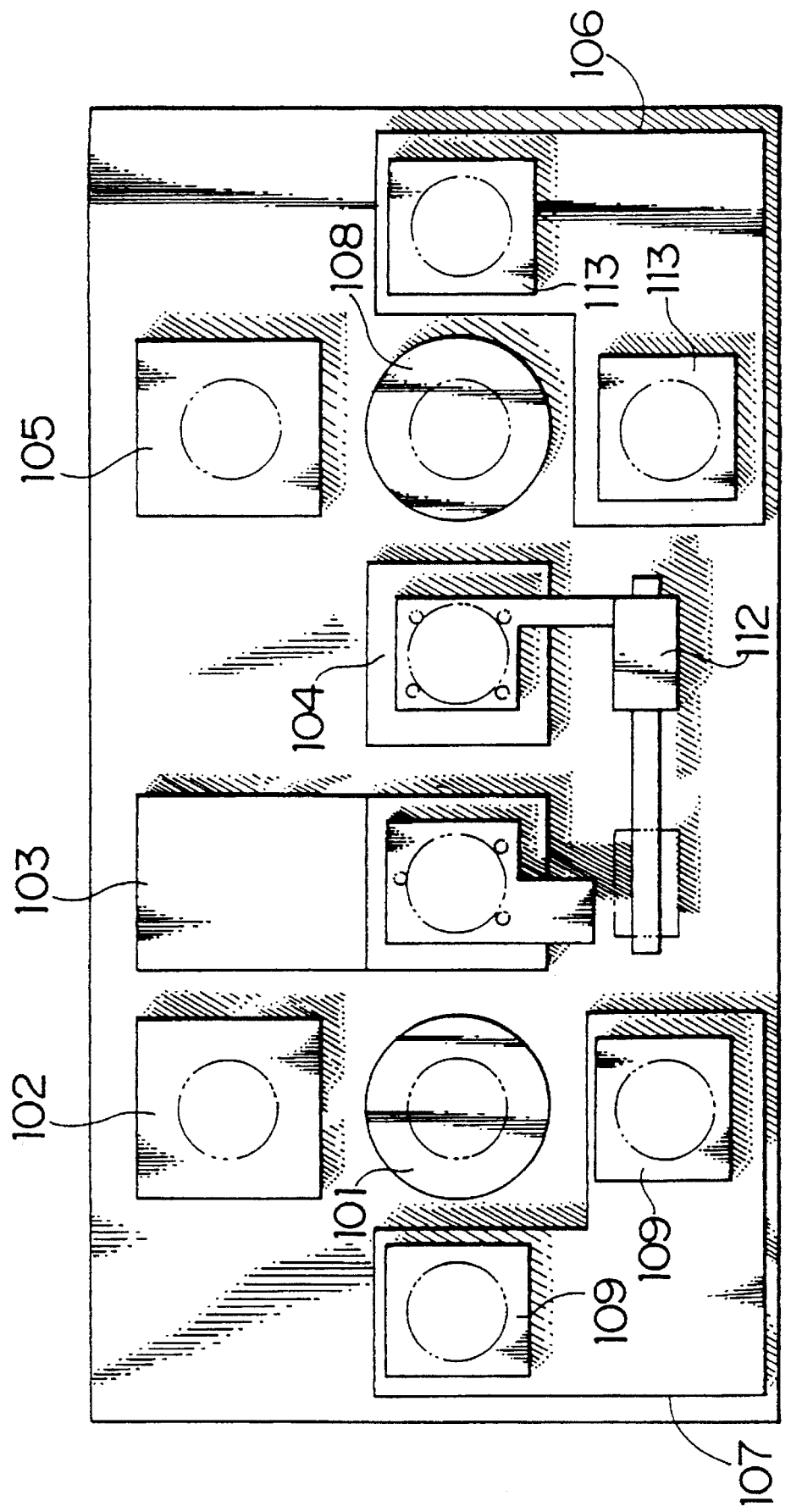
FIG. 15 is a plan view of a wafer chamfering machine.

FIG. 12 is a block diagram showing the overall construction wherein the wafer chamfering machine is provided in the wafer diameter/sectional shape measuring machine according to the present invention. And, FIG. 15 is a plan view of the wafer chamfering machine and FIG. 16 is a plan view for explaining the processing steps in the wafer chamfering machine.

As shown in FIG. 12, the wafer chamfering machine comprises a wafer storing station 107, a wafer taking out station 101, a position control station 102, a chamfering station 103, a washing station 104, a wafer housing-conveying station 108, a peripheral measuring station 105, a wafer housing station 106, and the wafer conveying systems between the respective stations, further, the control means (not shown) for controlling all and the respective stations.

The wafer diameter/sectional shape measuring machine is integrated into the peripheral measuring station 105. When the wafer with the orientation flat is measured, in the wafer diameter/sectional shape measuring machine of FIG. 1, the wafer 10 is conveyed from the direction of the arrow A or the opposite direction to the arrow A by the wafer housing-conveying station 108 to the wafer table 21. In this case, the wafer table 21 goes down to the position in that the wafer 10 is not interfered with the rollers 50a and 50b of the position control means 30 while conveying the wafer 10, and goes up when the wafer 10 is conveyed to the wafer table 21.

The wafer 10, which is stored in the wafer cassette 109 of the wafer storing station 107, is taken out by the wafer taking out station 101 in sequence and sent to the position control station 102 to position the center of the circular part 11 and the orientation flat 12, and then, sent to the chamfering station 103. Next, at the chamfering station 103, the wafer 10 is adsorbed and held by the wafer table 110 and the periphery thereof is chamfered by a grindstone 111 for chamfering. And, when the peripheral chamfering of the wafer 10 is completed, the wafer 10 is sent to the washing station 104 by a washing-conveying means 112 and then washed. After washing, the wafer 10 is sent to the peripheral measuring station 105 and the diameter and the sectional shape are measured by the wafer diameter/sectional shape measuring machine. When the measuring is finished, the wafer 10 is housed in a rack 113 of the wafer housing station 106 by the wafer housing-conveying station 108, so that the chamfering can be finished. The data measured by the wafer diameter/sectional shape measuring machine are fed back to the chamfering station 103, and the later chamfering conditions are adjusted with the feed-back value in the chamfering station.

The wafer with the notch is similar to that with the orientation flat, therefore, the explanation thereof is omitted.

In the wafer diameter/sectional shape measuring machine according to the present invention, there is no substantial problem because the processing conditions of the orientation flat or the notch can be set based on the measured data of the diameter D of the circular part 11 and the sectional shape.

As described above, according to the wafer diameter/sectional shape measuring machine of the present invention, the diameter and the sectional shape of the wafer can be measured at the same time, therefore, it is not necessary to measure the diameter and the sectional shape with different machines, so that the time for measuring can be shortened.

Further, when the wafer chamfering machine is provided with the wafer diameter/sectional shape measuring machine, the measured results of the diameter and the sectional shape of the wafer are fed back to the wafer chamfering machine without taking the wafer out from the processing machine, therefore, the processing conditions of the wafer chamfering can be adjusted in a short time.

It should be understood, however, that there is no intention to limit the invention to the specific forms disclosed, but on the contrary, the invention is to cover all modifications, alternate constructions and equivalents falling within the spirit and scope of the invention as expressed in the appended claims.

I claim:

1. A wafer diameter/sectional shape measuring machine for measuring a wafer having a diameter, a sectional shape, and a center, said wafer also having either an orientation flat or a notch, comprising:

a rotatable wafer table for adsorbing and holding a wafer, said wafer table also being movable in a substantially linear direction;

position control means for positioning said center of said wafer and one of said orientation flat or said notch of said wafer at a predetermined position on said wafer table so that said center of said wafer corresponds to a rotational center of said wafer table;

shape detecting means for detecting said sectional shape of said wafer;

measuring means for driving said shape detecting means in a direction of said wafer table, said measuring means being provided with moving value detecting means for detecting a moving value of said shape detecting means;

image processing means for calculating said sectional shape of said wafer based on data detected by said shape detecting means; and size calculating means for calculating said diameter of said wafer based on a signal from said image processing means and a signal from said moving value detecting means.

2. A wafer diameter/sectional shape measuring machine as set forth in claim 1, wherein said wafer has a periphery, and said position control means includes wafer center positioning means, said wafer center positioning means includes;

a pair of arms arranged so as to be movable in directions for holding said wafer and for leaving from said wafer; and a plurality of rollers attached to said pair of arms at predetermined intervals, which are in contact with said periphery of said wafer so as to hold said wafer when said pair of said arms move in a direction for holding said wafer and support a held wafer rotatably at said center of said wafer.

3. A wafer diameter/sectional shape measuring machine as set forth in claim 1, wherein said position control means includes orientation flat positioning means, said orientation flat positioning means includes;

back and forth moving means which is movable back and forth in regard to said wafer of which said center is positioned by said position control means; and a plurality of rollers attached to said back and forth moving means, which are in contact with said orientation flat of said wafer when said back and forth means move back and forth in regard to said wafer and rotate said wafer so as to be at a predetermined position.

4. A wafer diameter/sectional shape measuring machine as set forth in claim 1, wherein said position control means includes notch positioning means, said notch positioning means includes; back and forth moving means which are movable back and forth in regard to said wafer of which said center is positioned by said position control means; and a roller attached to said back and forth moving means, which is in contact with said notch of said wafer when said back and forth means moves back and forth in regard to said wafer and rotates said wafer so that said notch is positioned at a predetermined position.

5. A wafer diameter/sectional shape measuring machine as set forth in claim 1, wherein said shape detecting means includes;

a projecting part for lightening said periphery of said wafer which is adsorbed and held by said wafer table; and a detecting part for taking said periphery of said wafer which is lightened by said projecting part, whereby said projecting part and said detecting part are located opposite to each other to hold said wafer in a direction of said diameter.

6. A wafer diameter/sectional shape measuring machine as set forth in claim 1, wherein said measuring means includes moving means for moving said shape detecting means in a direction of said diameter of said wafer which is adsorbed and held by said wafer table.

7. A wafer diameter/sectional shape measuring machine as set forth in claim 1, wherein said image processing means binarize data of a wafer sectional shape detected by said shape detecting means into white and black so as to output binarized image signals to a monitor, and calculate a wafer sectional shape value by reading a distance between a measured value in a diameter direction and a measured value in a thickness direction of said wafer sectional shape detected by said shape detecting means based on predetermined reference lines in said diameter direction and in said thickness direction of said wafer.

8. A wafer diameter/sectional shape measuring machine as set forth in claim 1, wherein said size calculating means contains a pre-set value for a radius F of a reference disc which is pre-set, and a distance Xa from a reference line in a diameter direction of said wafer to a peripheral position of said reference disc when said reference disc is measured by said shape detecting means; whereby said diameter D of said wafer is calculated with said radius F, said distance Xa, a distance Xb from a reference line in said diameter direction of said wafer which is read by said shape detecting means to a measured point in a diameter direction of a wafer sectional shape detected by said shape detecting means, and a moving value G of said shape detecting means based on a following formula:

$$D=2(F+Xa+G-Xb).$$

9. A wafer chamfering machine for chamfering a periphery of a wafer and washing said wafer after chamfering, said wafer having a diameter, a sectional shape, and a center, said wafer also having either an orientation flat or a notch, said wafer chamfering machine comprising:

a wafer diameter/sectional shape measuring machine for measuring said wafer integrated in said wafer chamfering machine, said wafer diameter/sectional shape measuring machine including:.

a wafer rotatable table for adsorbing and holding a wafer, said wafer table also being movable in a substantially linear direction;

position control means for positioning said center of said wafer and one of said orientation flat or said notch of said wafer at a predetermined position on said wafer table so that said center of said wafer corresponds to a rotational center of said wafer table;

shape detecting means for detecting said sectional shape of said wafer;

measuring means for driving said shape detecting means in a direction of said wafer table, said measuring means being provided with moving value detecting means for detecting a moving value of said shape detecting means;

image processing means for calculating said sectional shape of said wafer based on data detected by said shape detecting means; and size calculating means for calculating said diameter of said wafer based on a signal from said image processing means and a signal from said moving value detecting means whereby said diameter and said sectional shape of said wafer chamfered by said wafer chamfering machine are measured by said wafer diameter/sectional shape measuring machine, and measured data is fed back to said wafer chamfering machine so as to adjust later chamfering conditions of said wafer based on said measured data which are fed back.

* * * * *